(12) United States Patent
Cheung et al.

(10) Patent No.: US 10,530,124 B2
(45) Date of Patent: Jan. 7, 2020

(54) TUNABLE LASER

(71) Applicant: HEWLETT PACKARD ENTERPRISE DEVELOPMENT LP, Houston, TX (US)

(72) Inventors: Stanley Cheung, Palo Alto, CA (US); Michael Renne Ty Tan, Menlo Park, CA (US); Wayne V Sorin, Mountain View, CA (US); Joaquin Matres Abril, Palo Alto, CA (US); Sagi Mathai, Sunnyvale, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/593,072

(22) Filed: May 11, 2017

(65) Prior Publication Data

US 2018/0331500 A1    Nov. 15, 2018

(51) Int. Cl.
*H01S 5/10* (2006.01)
*H01S 5/40* (2006.01)
*H01S 5/02* (2006.01)
*H01S 5/14* (2006.01)

(52) U.S. Cl.
CPC .......... *H01S 5/1014* (2013.01); *H01S 5/4068* (2013.01); *H01S 5/021* (2013.01); *H01S 5/101* (2013.01); *H01S 5/141* (2013.01); *H01S 5/4062* (2013.01)

(58) Field of Classification Search
CPC ........ H01S 5/125; H01S 5/101; H01S 5/1014; H01S 5/1021; H01S 5/1007; H01S 5/4012; H01S 5/4068; H01S 5/021
See application file for complete search history.

(56) References Cited

U.S. PATENT DOCUMENTS

| | | | | |
|---|---|---|---|---|
| 4,737,962 | A * | 4/1988 | Yamamoto | H01S 5/028 372/26 |
| 5,333,219 | A * | 7/1994 | Kuznetsov | G02B 6/125 359/340 |
| 6,980,720 | B2 * | 12/2005 | Gothoskar | G02B 6/1228 385/129 |
| 8,615,025 | B2 | 12/2013 | Dallesasse et al. | |

(Continued)

FOREIGN PATENT DOCUMENTS

CN    100463312    2/2009
EP    2544319 A1 *    1/2013    ........... H01S 5/1032

OTHER PUBLICATIONS

Chris Hessenius, "Novel Cavities and Functionality in High-power High Brightness Semiconductor Vertical External Cavity Surface Emitting Lasers," Jan. 31, 2017, 163 pages.

(Continued)

*Primary Examiner* — Xinning(Tom) Niu
*Assistant Examiner* — Sean P Hagan
(74) *Attorney, Agent, or Firm* — Sheppard Mullin Richter & Hampton LLP

(57) ABSTRACT

Examples of the present disclosure include a tunable laser comprising an optical coupler to couple light between a first laser cavity and a second laser cavity. The first laser cavity may extending between the optical coupler and a first reflector and include a first gain section. The second laser cavity may extend between the optical coupler and a second reflector and including a second gain section. At least one of the first laser cavity and the second laser cavity is tunable.

17 Claims, 12 Drawing Sheets

(56) References Cited

U.S. PATENT DOCUMENTS

| | | | |
|---|---|---|---|
| 9,270,078 | B2 | 2/2016 | Rickman et al. |
| 2003/0007719 | A1* | 1/2003 | Forrest .................. B82Y 20/00 |
| | | | 385/14 |
| 2010/0142567 | A1* | 6/2010 | Ward .................. H01S 5/06256 |
| | | | 372/20 |
| 2014/0153601 | A1 | 6/2014 | Doerr et al. |
| 2015/0207296 | A1 | 7/2015 | Rickman et al. |
| 2016/0134082 | A1 | 5/2016 | Li et al. |
| 2017/0184787 | A1* | 6/2017 | D'Agostino ......... G02B 6/2813 |

OTHER PUBLICATIONS

G.H. Duan, "Integrated Hybrid III-V /SI Laser and Transmitter," IEEE, 39th International Symposium on Compound Semiconductors, Aug. 27-30, 2012, 6 pages, <http://www photonics intec ugent be/download/pub 3017 pdf>.

Quanan Chen, "Theory and Simulation of Multi-channel Interference (MCI) Widely Tunable Lasers," 2015, 12 pages, <https://www osapublishing org/oe/fulltext cfm?url=oe-23-14-18040>.

Toru Segawa, "A Flat-output Widely Tunable Laser Based on Parallel-ring Resonator Integrated with Electroabsorption Modulator," Dec. 10, 2012, 8 pages, <https://www.osapublishing.org/DirectPDFAccess/ 852AF5FA-B240-0F68-CEEDC6D1CAD5F 577_246674/oe-20-26-B485.pdf?da=1&id=246674&seq=0&mobile=no >.

Hulme et al., "Widely tunable Vernier ring laser on hybrid silicon", 2013 Optical Society of America, 5 pages.

He et al., "Tunable V-cavity Semiconductor Laser and Modules", Progress In Electromagnetics Research Symposium Proceedings, Guangzhou, China, Aug. 2014, pp. 333-336.

\* cited by examiner

TUNABLE LASER

BACKGROUND

A tunable laser is a laser for which the wavelength of output laser light can be varied in a controlled manner Tunable lasers have many applications including as a variable source of light for wavelength division multiplexing (WDM) systems, spectroscopic measures, light detection and ranging and beam steering etc.

BRIEF DESCRIPTION OF THE DRAWINGS

Examples of the disclosure will now be described, by way of non-limiting example, with reference to the accompanying drawings, in which.

DETAILED DESCRIPTION

For simplicity and illustrative purposes, the present disclosure is described by referring mainly to examples thereof. As used herein, the terms "includes" means includes but not limited to, the term "including" means including but not limited to. The term "comprises" means includes but not limited to, the term "comprising" means including but not limited to. The term "based on" means based at least in part on. The term "number" means any natural number equal to or greater than one. The terms "a" and "an" are intended to denote at least one of a particular element. Several examples and diagrams refer to layers of an assembly and their relative positions. The terms "positioned over" and "overlies" means positioned above and includes directly above and above with one or more layers in between. The terms "positioned under" and "underlies" mean positioned below and includes directly below and below with one or more layers in between. Where the present disclosure refers to layers, it is to be understood that each layer may itself comprise one or more sub-layers.

Photonic devices may include semiconductor materials. Silicon, Germanium and certain other semiconductors have an indirect bandgap. An indirect band gap semiconductor is a semiconductor in which the maximum energy of the valence band occurs at a different value of momentum to the minimum energy of the conduction band. As such indirect bandgap semiconductors are suitable for constructing waveguides, gratings and mirrors, but are not optimum for the construction of light emitting devices.

Certain photonic devices, especially lasers and other light producing devices, are best implemented using direct bandgap semiconductors. A direct bandgap (DBG) semiconductor is a semiconductor in which the maximum energy of the valence band and the minimum energy of the conduction band occur at the same value of momentum. Group III-V semiconductors are one example of direct bandgap semiconductors. A Group III-V semiconductor is a semiconductor including at least one element from Group III or Group V of the Periodic Table. In some examples, Group III-V semiconductors may be compound semiconductors, which are semiconductors composed of two or more elements.

A widely tunable laser is a tunable laser for which the output wavelength can be varied in a controlled manner over a significant range, for example at least a difference of 10 nm and in some cases a difference of 40 nm or more between the lowest wavelength and the highest wavelength. The tuning may be discrete between a number of predetermined wavelengths within said range or may be continuous between the upper and lower bounds of the range. It would be desirable to have a tunable laser with a wide range of tunability, high side mode suppression ratio (SMSR), a small footprint and simple fabrication.

Figure 1:
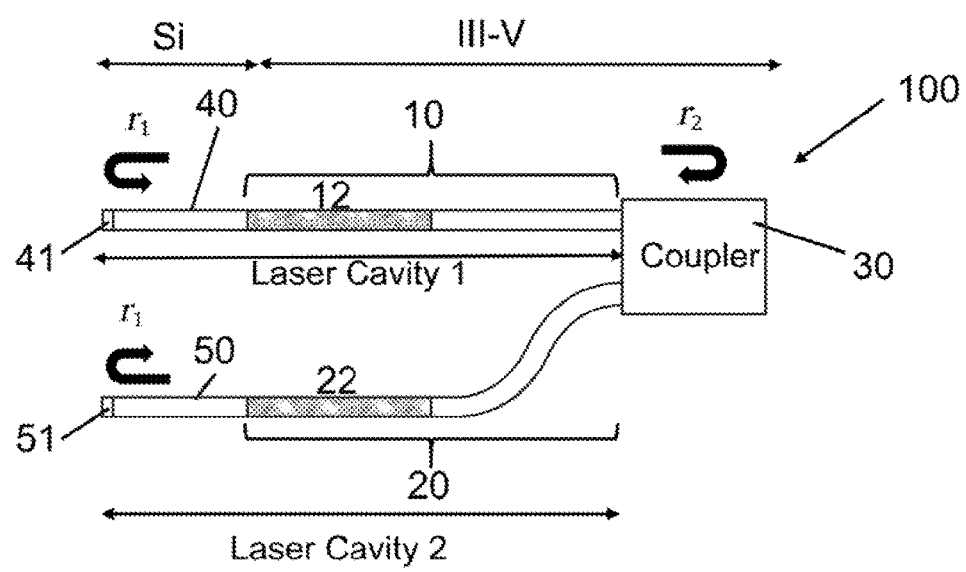
FIG. 1 is a schematic view of an example tunable laser according to the present disclosure.

FIG. 1 shows a schematic view of a tunable laser 100 according to an example of the present disclosure. The tunable laser 100 includes a Silicon-based portion (Si) and a group III-V semiconductor portion (III-V) as indicated schematically by the arrows at the top of the diagram. The laser 100 may thus be referred to as a hybrid laser as it includes both Silicon-based and III-V semiconductor materials. In this context silicon-based means including silicon or a compound of silicon such as silicon nitride.

The laser 100 includes a first laser cavity 1 and a second laser cavity 2. It is important to note that each of the first and second laser cavities 1, 2 includes both a Silicon-based portion and a III-V semiconductor portion. Thus the first laser cavity 1 includes a first III-V waveguide 10 and a first silicon-based waveguide 40, while the second laser cavity 2 includes a second III-V waveguide 20 and a second silicon-based waveguide 50. The first III-V waveguide 10 includes a first gain section 12, while the second III-V waveguide 20 includes a second gain section 22. A gain section is a section which is to generate or amplify light. For example, the gain section may generate or amplify light in response to application of an electrical current. At least one of the first laser cavity 10 and the second laser cavity 20 is tunable. Tunable means that the wavelength(s) of light amplified by the gain section of the laser cavity may be adjusted in a controlled manner. In one example, the first and/or second gain sections are tunable and tuning of the first and/or second laser cavity may be achieved by tuning of the first and/or second gain section.

The first III-V waveguide 10 is connected at a first end to a III-V optical coupler 30 and optically coupled at a second end to the first silicon-based waveguide 40. The first silicon-based waveguide includes a first reflector 41. The second III-V waveguide 20 is connected at a first end to a III-V optical coupler 30 and optically coupled at a second end to the second silicon-based waveguide 50. The second silicon-based waveguide includes a second reflector 51.

In the context of this disclosure, the term connected means that light may propagate directly—e.g. from the first III-V waveguide 10 to the optical coupler 30. The term "optically coupled" means that light may transfer between two separate waveguides—e.g. from the first III-V waveguide 10 to the first silicon-based waveguide 40 via an optical coupling mechanism between the waveguides, or from the first III-V waveguide 10 to the second III-V waveguide 20 via the optical coupler 30.

It will be appreciated from the above structure, that the first laser cavity 1 is terminated at one end by the III-V optical coupler 30 and at the other end by the reflector 41. Likewise, the second laser cavity 2 is terminated at one end by the III-V optical coupler 30 and at the other end by the reflector 51. Thus light may be reflected within the laser cavities as shown by the arrows r1 at the reflector ends and r2 at the optical coupler end. The arrow r1 denotes reflection by the reflectors 41, 51 of the silicon-based waveguides, while the arrow r2 denotes reflection by the optical coupler 30 or coupling of light between the first laser cavity 1 and second laser cavity 2 via the optical coupler 30.

The first laser cavity may have a first free spectral range (FSR), while the second laser cavity may have a second free spectral range (FSR) which is different to the first FSR. The FSR of a laser cavity is the spacing between successive resonant wavelengths within the laser cavity. As the first laser cavity 1 is optically coupled to the second laser cavity 2 via the optical coupler 30 and as the first laser cavity 1 and the second laser cavity 2 have different FSRs, this may give rise to a Vernier effect that facilitates precise tuning of an output wavelength of the laser.

Figure 2:
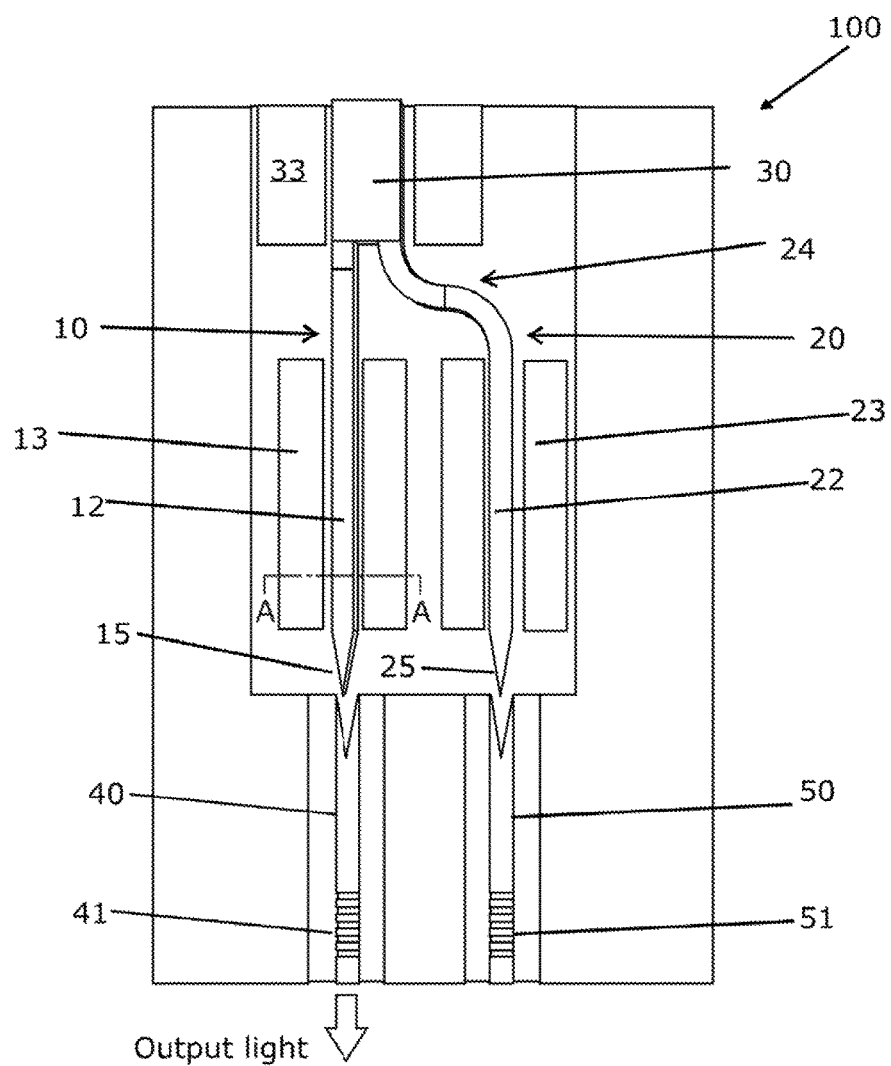
FIG. 2 is a top-down view of an example tunable laser according to the present disclosure.
Figure 3:
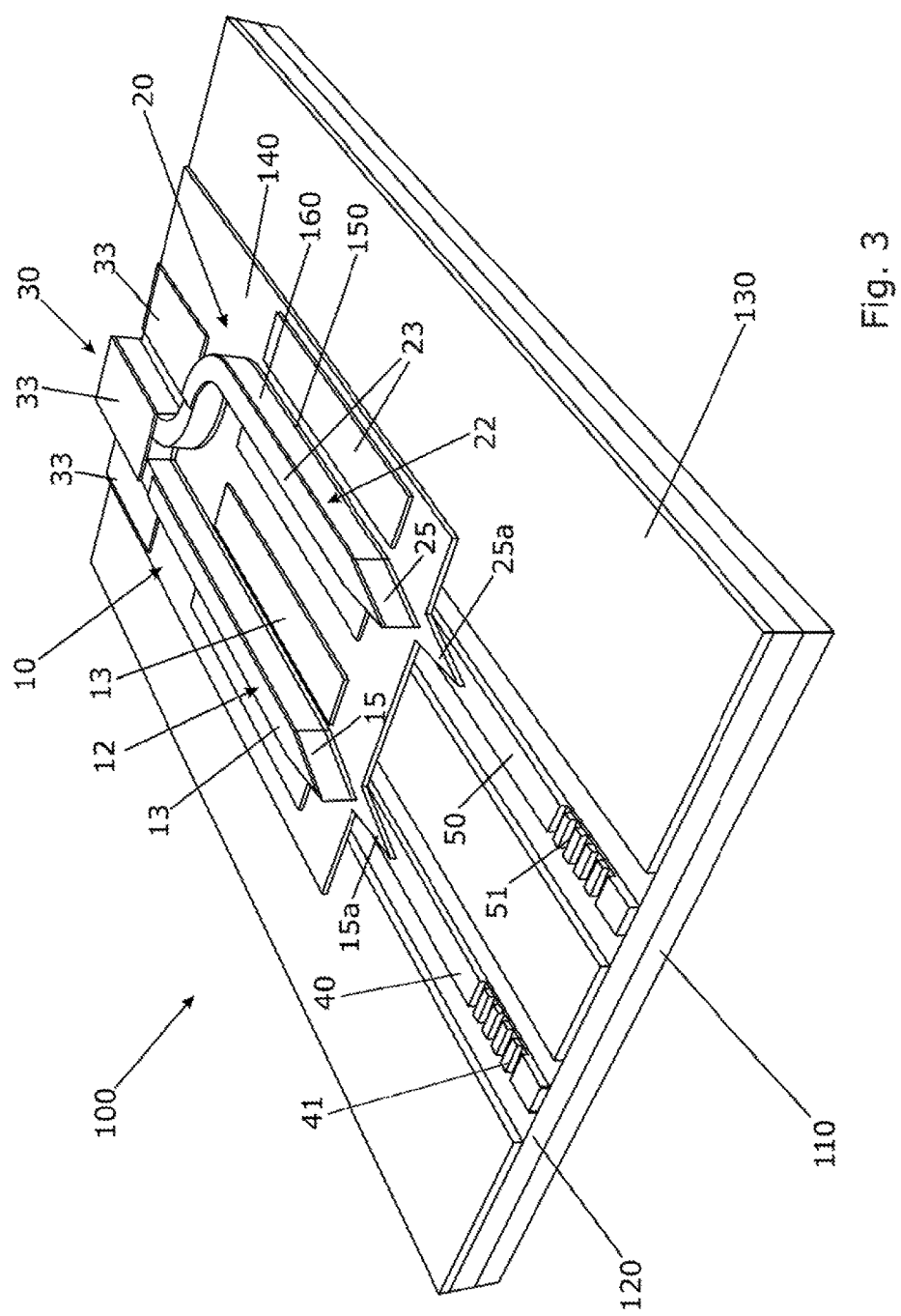
FIG. 3 is a perspective view of an example tunable laser according to the present disclosure.

The tunable laser 100 may be formed on a photonics integrated chip. Photonic integrated chips may be produced cheaply, at high volume and to a reliable quality using semiconductor manufacturing techniques adapted from the semiconductor electronics industry. FIG. 2 shows a top-down view of an example photonics integrate chip providing a tunable laser having a structure similar to that shown schematically in FIG. 1. FIG. 3 is a perspective view from above of the laser of FIG. 2. The tunable laser may have a relatively small foot print. In one example an area occupied by the tunable laser shown in FIG. 2 may be 500 µm×200 µm or less.

As can be seen in FIGS. 2 and 3, the tunable laser includes a III-V semiconductor structure mounted on a silicon on insulator (SOI) structure which together form a tunable laser 100. The III-V structure is formed of direct bandgap semiconductors and is thus suitable for generating light, while the SOI structure may facilitate easy optical coupling to other silicon-based photonic circuitry. Provision of both the III-V semiconductor structure and the SOI structure on the same photonics integrated chip allows for efficient manufacturing of the tunable laser.

The SOI structure may include a first silicon based layer 110 of relatively higher refractive index, such as Silicon (Si) or Silicon Nitride ($Si_3N_4$), an insulator layer 120 of relatively lower refractive index such as silicon dioxide ($SiO_2$) and a second silicon-based layer 130 of relatively higher refractive index, such as Silicon (Si) or Silicon Nitride ($Si_3N_4$). The insulator layer 120 is located between the first and second silicon-based layers, e.g. first silicon-based layer 110 may underlie insulator layer 120 and second silicon-based layer 130 may overlie insulator layer 120. The first silicon-based waveguide 40 and the second silicon-based waveguide 50 may be formed in the second silicon-based layer 130.

The III-V structure includes a first branch 10, a second branch 20 and an optical coupler 30 which optically couples a first end of the first branch to a first end of the second branch. The first and second branches 10, 20 may be thought of as III-V semiconductor waveguides which are connected at their first ends to the optical coupler 30. The optical coupler may for example be a multimode-interference coupler, a directional coupler or other type of coupler. The optical coupler 30 may be controlled by electrical contacts, such as metal layers, 33 on top of and to either side of the optical coupler, as shown in FIG. 3.

The first III-V waveguide 10 includes a first gain section 12 which may amplify light passing through it. For instance the gain section may include an optically active laser material, quantum well, multiple quantum well (MQW) or quantum dots etc. The arrangement may include electrical contacts 13 through which a potential difference may be applied to the gain section 12 to stimulate optical gain. FIGS. 2 and 3 show an electrical contact 13 on top of the gain section 12 and electrical contacts 13 on either side of the gain section 12. Likewise, the second III-V waveguide 20 includes a gain section 22 and electrical contacts 23 for applying a potential difference across the gain section to stimulate optical gain. The illustrated examples shows electrical contacts 23 on top of the gain section 22 and on either side of the gain section.

As shown in FIGS. 2 and 3, the electrical contacts 13 of the first gain section and the electrical contacts 23 of the second gain region are electrically isolated from the electrical contact(s) 33 of the optical coupler. Thus, the first gain section 12, second gain section 22 and the optical coupler 30 may be controlled independently of each other.

Each of the first III-V waveguide, the second III-V waveguide and the optical coupler may include an active layer 150 positioned between a lower cladding layer 140 and an upper cladding layer 160. In the example shown in FIG. 3, the first III-V waveguide, the second III-V waveguide and the optical coupler are integral parts of the same III-V structure, such that the active layer 150, upper cladding layer 160 and lower cladding layer 140 extend through all three parts. The active layer 150 may include an optically active laser material, quantum well, multiple quantum well (MQW) or quantum dots etc. The active layer may generate or amplify light in response to application of an electric potential. Meanwhile, the cladding layers may at least partially confine light photons within the active layer.

In one example the upper cladding layer 160 and lower cladding layer 140 may comprise InP and the active layer 150 may comprise AlInGaAs. In another example, the upper cladding layer and the lower cladding layer may comprise InP and the active layer may comprise InGaAsP. In the example of FIG. 3, the lower cladding layer 140 is a planar layer that is positioned over the SOI structure and has a width greater than the combined width of the first III-V waveguide, second III-V waveguide and the space between them. Meanwhile the active layer 150 and the upper cladding layer 160 may define the shape of the III-V waveguides 10, 20 and the optical coupler 30.

As mentioned above, there are respective optical coupling mechanisms to optically couple the first III-V waveguide 10 to the first silicon-based waveguide 40 and to optically couple the second III-V waveguide 20 to the second silicon-based waveguide 50.

In the example shown in FIGS. 2 and 3 the optical coupling mechanism is a taper transition tip of the III-V waveguide. For instance, each III-V waveguide has a taper region which gradually narrows in width towards a tip at the end of the waveguide. Thus the first III-V waveguide 10 includes a first taper transition tip 15 to optically couple light from the first III-V waveguide to the first silicon-based waveguide 40. The second III-V waveguide 20 includes a second taper transition tip 25 to optically couple light from the second III-V waveguide 20 to the second silicon-based waveguide 50.

In the context of this disclosure, the width of a waveguide is the extent of the waveguide in a direction perpendicular to the direction or propagation of light in the waveguide and parallel to a plane below the waveguide. E.g. in the x-axis or left to right direction in FIG. 2. Note that the relative widths of the III-V and silicon-based waveguides shown in FIGS. 1 to 3 are not to scale. The width of the first and second III-V waveguides 10, 20 is in fact much greater than the respective widths of the first and second silicon-based waveguides 40, 50. For instance, the first and second III-V waveguides 10, 20 may each have a width in the order of 1000s of nm, while the first and second silicon-based waveguides may each have a width of the order of 100s of nm.

In one example, the first gain section 12 of the first III-V waveguide has a width at least three times larger than a width of the first silicon waveguide 40 and the second gain section 22 of the second III-V waveguide has a width at least three times larger than a width of the second silicon waveguide. In another example the first gain section 12 of the first III-V waveguide has a width at least five times larger than a width of the first silicon waveguide 40 and the second gain section 22 of the second III-V waveguide has a width at least five times larger than a width of the second silicon waveguide.

The first taper transition tip 15 of the first III-V waveguide may have a width less than the width of the silicon-based waveguide 40 which it is coupled to. Likewise, the second taper transition tip 25 of the second III-V waveguide may have a width less than the width of the silicon-based waveguide 50 which it is coupled to. In this context, the width of a taper transition tip is considered to be the width at the narrowest point of the tip.

In one example, the III-V waveguides may have widths of 2 μm to 3 μm (i.e. 2000 nm to 3000 nm). The width of each of the first and second III-V waveguides may vary a bit along their length but may generally be within this range. Meanwhile, the silicon-based waveguides may have widths of 200-600 nm. In one example each of the silicon-based waveguides is approximately 500 nm in width.

The taper transition tips 15, 25 enhance evanescent coupling from the first and second III-V semiconductor waveguides 10, 20 to the respective first and second silicon-based waveguides 40, 50 below. In effect light travelling through the transition tip is squeezed out of the III-V waveguide and optically coupled into the silicon-based waveguide below.

The first silicon-based waveguide 40 extends below at least the taper transition tip 15 of the first III-V waveguide so that light may be optically coupled from the taper transition tip 15 to the first silicon-based waveguide 10. In some examples, the first silicon-based waveguide 40 may extend below other parts of the first III-V waveguide 10 as well, for example below at least a portion of the first gain section 12. Likewise, the second silicon-based waveguide 50 extends below at least the taper transition tip 25 portion of the second III-V waveguide 20 so that light may be optically coupled from the taper transition tip 25 to the second silicon-based waveguide 50. In some examples, the second silicon-based waveguide 50 may extend below other parts of the second III-V waveguide 20 as well, for example at least a portion of the second gain section 22.

In some examples, the first taper transition tip 15 may comprise two sections. A first taper section 15 including the upper cladding layer 160 and the active layer 150 and a second taper section 15a including the lower cladding layer 140, which second taper section extends beyond the first taper section. Likewise, the second taper transition tip 25 may include both a first taper section 25 and a second taper section 25a. Having a first taper transition tip section including the upper and lower cladding layers 140, 160 and the active layer 150, and a second taper transition tip formed of the lower cladding layer 140, without the active layer 150 and the upper cladding layer 160, may help to prevent unwanted residual reflections. This is particularly the case if the manufacturing process involves first adding the III-V structure on top of the SOI structure and then removing a portion of the lower cladding layer 140 in order to expose the silicon-based waveguide beneath.

Figure 4:
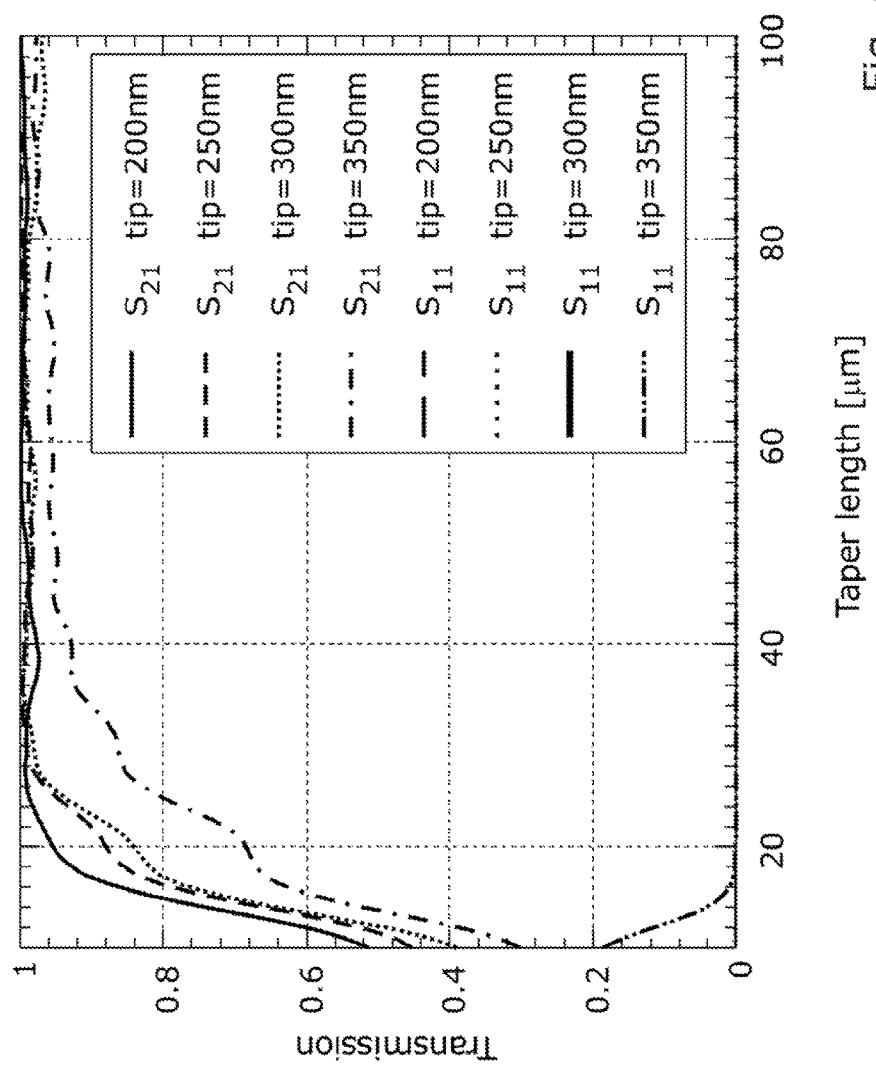
FIG. 4 is a graph showing transmission against taper transition tip length for an example taper transition tip of a III-V semiconductor waveguide.

FIG. 4 shows a graph showing an example of transmission versus taper transition tip length in μm. Taper transition tip length may be measured as the distance along the direction of propagation of light in the III-V waveguide from the main section of the III-V waveguide where the tapering starts to the narrowest point of the tip. Transmission is expressed as a fraction of the light optically coupled from the III-V waveguide to silicon-based waveguide or vice versa. The lines $S_{21}$ show transmission from the III-V waveguide to the silicon-based waveguide below for various III-V waveguide taper transition tip widths from 200 nm to 350 nm. Meanwhile the lines $S_{11}$ show back reflection from the III-V waveguide back into the III-V waveguide at the taper transition tip. Back reflection is significant for taper transition tips having a width of 350 nm and a length lower than 20 μm. However, for narrow tips, e.g. 300 nm or less the back reflection is not significant. Thus $S_{11}$ lines for tips 300 nm and narrower cannot be seen on the graph. Therefore in one example, the taper transition tips have a length greater than 20 μm and/or a tip width of less than 350 nm. In one example, each taper transition tip has a length of at least 40 μm. This may help to ensure good transmission from the III-V waveguide to the associated silicon-based waveguide.

Figure 5A:
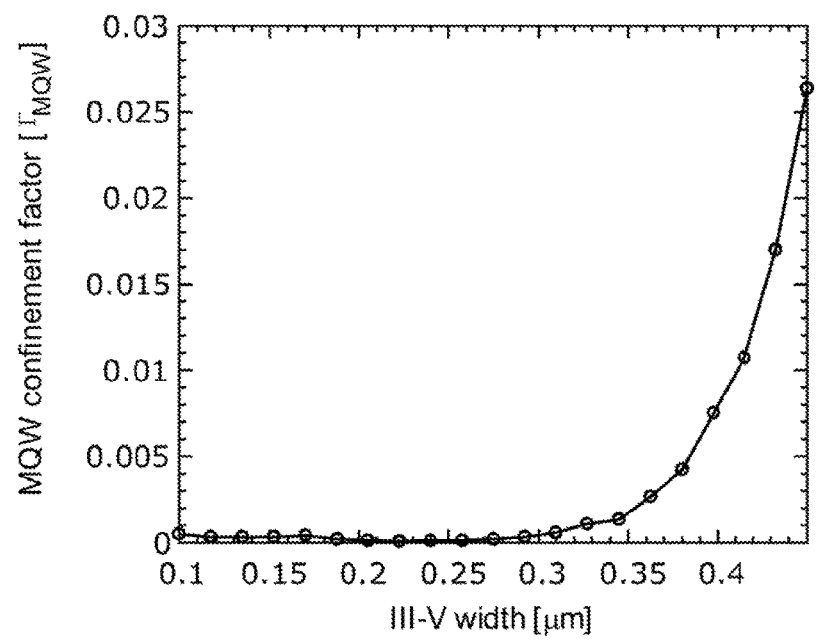
FIG. 5A is a graph showing MQW confinement factor against wavelength for an example waveguide.
Figure 5B:
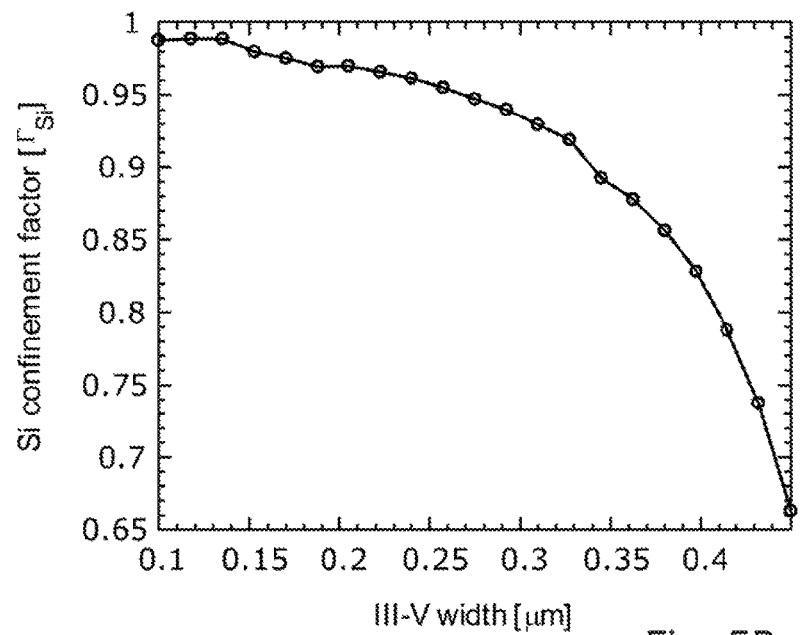
FIG. 5B is a graph showing silicon confinement factor against wavelength for an example waveguide.

FIGS. 5A and 5B show how the confinement factors in the III-V waveguide and the Silicon-based waveguide vary with III-V waveguide width, in the taper tip transition region. The confinement factor is defined as the portion of light that is in the respective regions. For instance, as can be seen in FIG. 5A, for a III-V tip width of 0.4 um, ΓMQW=1%, which means that 1% of the light is in the MQW region of the III-V waveguide. Likewise, as seen in FIG. 5B, for a III-V tip width of 0.4 um, ΓSI=82%, which means that 82% of the light is in the Silicon-based waveguide. That means, 17% of the remaining light is in other regions, such as the cladding layers 140, 160 of the III-V or a cladding layer of the silicon-based waveguide, such as $SiO_2$. These graphs thus show how light is pushed down from the MQW of the III-V waveguide to the silicon-based waveguide as the III-V waveguide narrows towards the taper transition tip. For the purposes of these illustrative graphs, the width of the silicon-based waveguide is assumed to remain constant, for instance at around 500 nm.

As mentioned above, the first silicon-based waveguide 40 includes a first reflector 41 and the second silicon-based waveguide 50 includes a second reflector 51. The reflectors may be positioned at respective ends of the silicon-based waveguides. In the example of FIGS. 2 and 3, the first and second reflectors 41, 51 are distributed bragg reflectors (DBRs). A distributed bragg reflector is a waveguide structure which has a periodic variation of some characteristic of the waveguide, resulting in periodic variation the effective refractive index of the waveguide. For example, the height of the waveguide in the DBR may vary periodically as shown in FIGS. 2 and 3. Each boundary between sections of different refractive index causes a partial reflection of an optical wave. Many of the reflections may combine with constructive interference, such that the DBR acts as a high-quality reflector. A DBR may reflect a specific range of wavelengths referred to as the photonic stopband. Within this range of wavelengths, light is reflected and does not pass the DBR structure. In other examples, the first and second reflectors 41, 51 could be mirrors such as deeply etched slots in the silicon-based waveguides, or cleaved or etched facets at the ends of the silicon-based waveguides. DBRs are more complicated to manufacture than slots or facets, but give much more flexibility regarding the reflectance. A DBR may be designed to have any of a wide range of reflectances, compared to slots and facets which tend to have a set fixed reflectance. In the context of this disclosure, the reflectance of a reflector is the proportion of incident light which the reflector reflects back into the waveguide.

One of the first reflector 41 and the second reflector 51 may have a lower reflectance than the other. The reflector with the lower reflectance may be associated with an output of the tunable hybrid laser. In the example of FIG. 2, the first reflector 41 has a lower reflectance than the second reflector 51. A portion of the resonant laser light within the first cavity may escape through the first reflector 41. The first reflector 41 may thus act as the output of the tunable laser. In one example, the first reflector 41 may have a reflectance of between 30% and 80%, while the second reflector 51 may have a reflectance of close to 100%, e.g. 99% or greater.

Figure 6A:
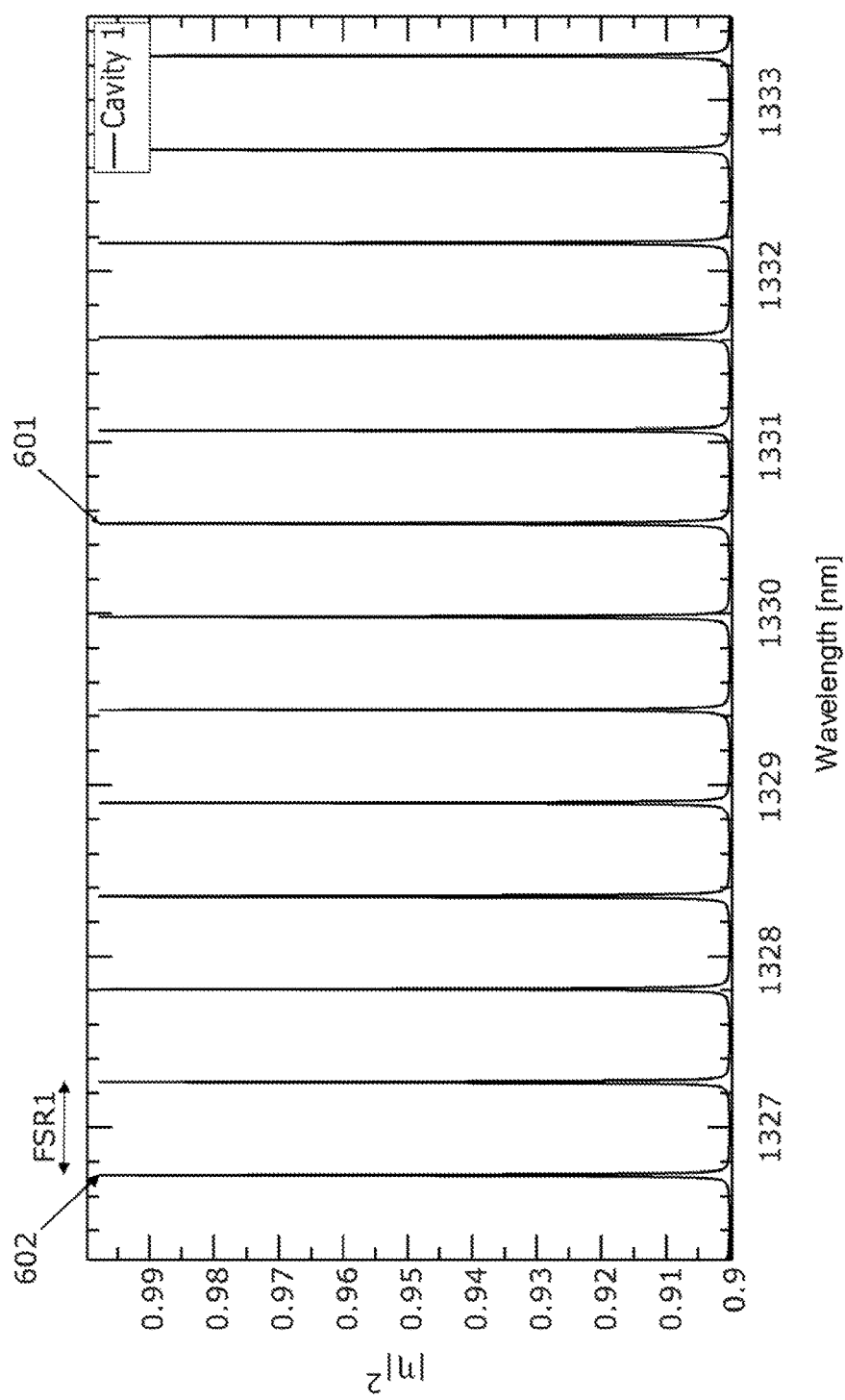
FIG. 6A is a graph showing example resonant frequencies for a first laser cavity.

Light in the first laser cavity 1 may be reflected between the reflector 41 and the optical coupler 30 as shown in FIG. 1. Therefore light in the first cavity 1 may have a plurality of resonant wavelengths. An example of this is shown in FIG. 6A. The y-axis shows the effective reflection factor vs wavelength on the x-axis. The resonant wavelengths are those for which there is a peak, for instance 601 and 602. The first cavity 1 may have a first free spectral range (FSR), which is the spacing between successive resonant wavelengths, for example as shown by the arrow FSR1 in FIG. 6A.

Figure 6B:
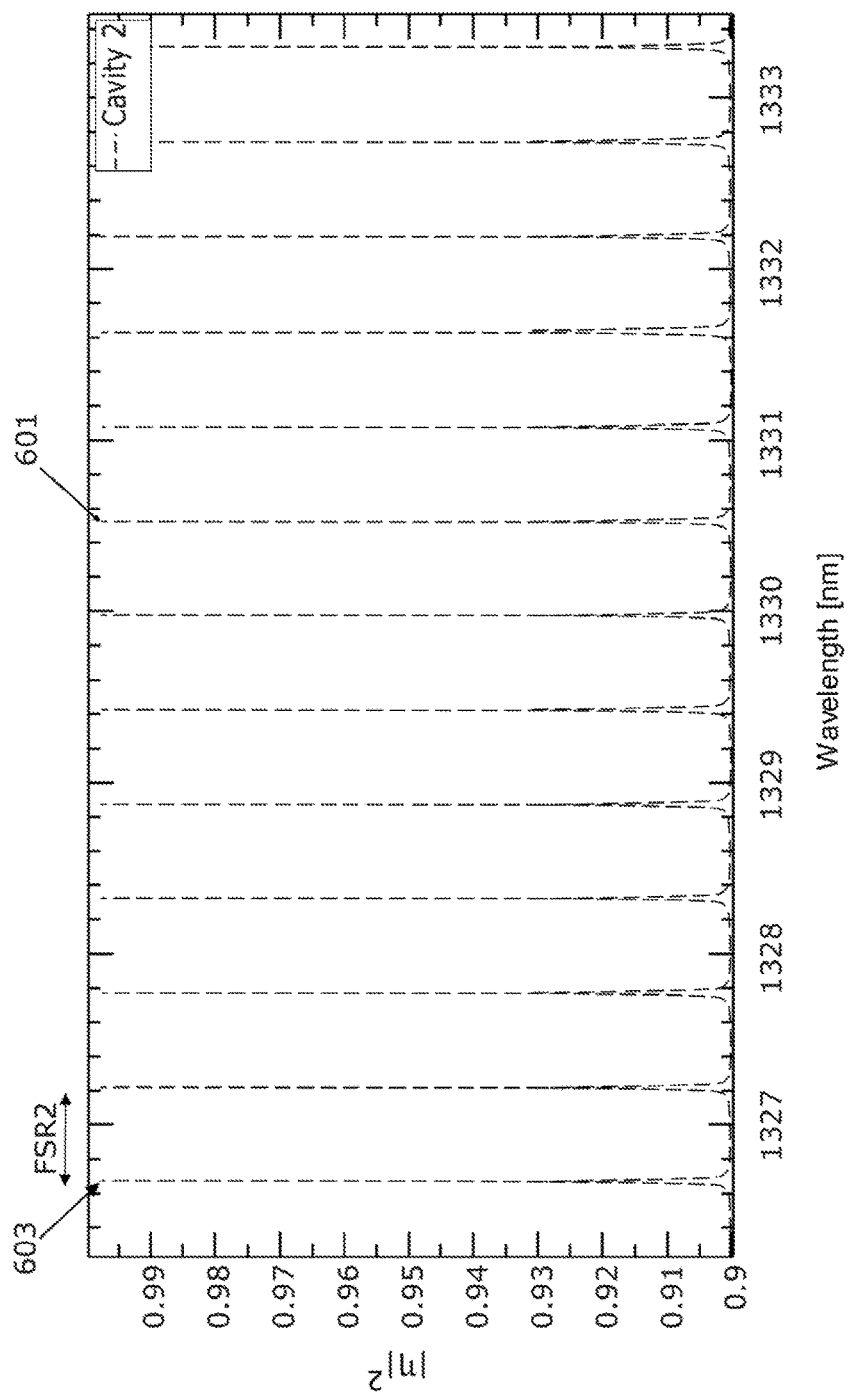
FIG. 6B is a graph showing example resonant frequencies for a second laser cavity.

Light in the second laser cavity 2 may be reflected between the reflector 51 and the optical coupler 30 as shown in FIG. 1. Therefore light in the second cavity 2 may have a plurality of resonant wavelengths, an example of which is shown in FIG. 6B. The resonant wavelengths are those for which there is a peak, for instance 601 and 603. The second cavity 2 may have a second free spectral range (FSR), which is the spacing between successive resonant wavelengths for example as shown by the arrow FSR2 in FIG. 6B.

Figure 6C:
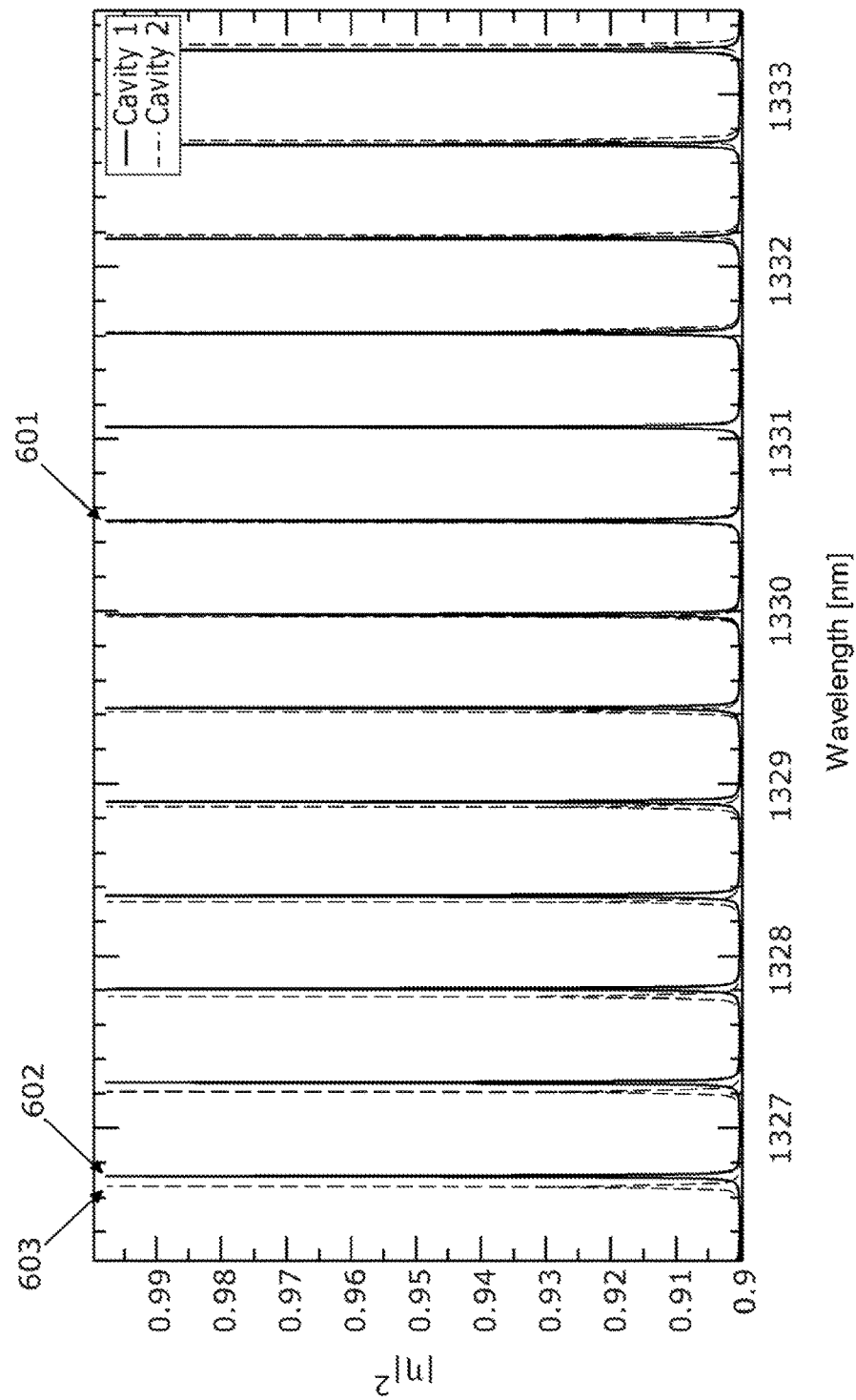
FIG. 6C is a graph showing the example resonant frequencies of the first and second laser cavities superimposed.

The first FSR (FSR1) and the second FSR (FSR2) are different from each other. Therefore many of the wavelengths which are resonant in the first cavity are not resonant in the second cavity and vice versa. Put another way, only some of the wavelengths are resonant in both the first cavity and the second cavity. FIG. 6C shows a superposition of FIGS. 6A and 6B, i.e. a superposition of the wavelengths resonant in the first cavity and the wavelengths resonant in the second cavity. In this example, FIGS. 6A to 6C show resonant wavelengths in the range 1326 nm to 1334 nm. It can can be seen from FIG. 6C that in this range only one of the resonant wavelengths 601 overlaps. In this context an overlapping resonant wavelength means a wavelength which is resonant in both the first laser cavity and the second laser cavity.

In this example, the overlapping resonant wavelength 601 is approximately 1330.5 nm. Meanwhile other resonant wavelengths of the first and second cavities do not overlap in the range shown in FIG. 6C. For example, the wavelength 602 which is resonant in the first cavity is not resonant in the second cavity. Likewise the resonant wavelength 603 which is resonant in the second cavity is not resonant in the first cavity.

As the first laser cavity and second laser cavity are optically coupled, light may be coupled from the first laser cavity to the second laser cavity by the optical coupler 30 and light may be coupled from the second laser cavity to the first laser cavity by the optical coupler 30. Therefore resonant wavelengths of the first laser cavity may enter the second laser cavity and resonant wavelengths of the second laser cavity may enter first laser cavity. These resonant wavelengths may interfere with each other. The result is that overlapping resonant wavelengths, i.e. wavelengths which are resonant in both the first cavity and the second cavity may interfere constructively, while other resonant wavelengths may interfere destructively.

Figure 6D:
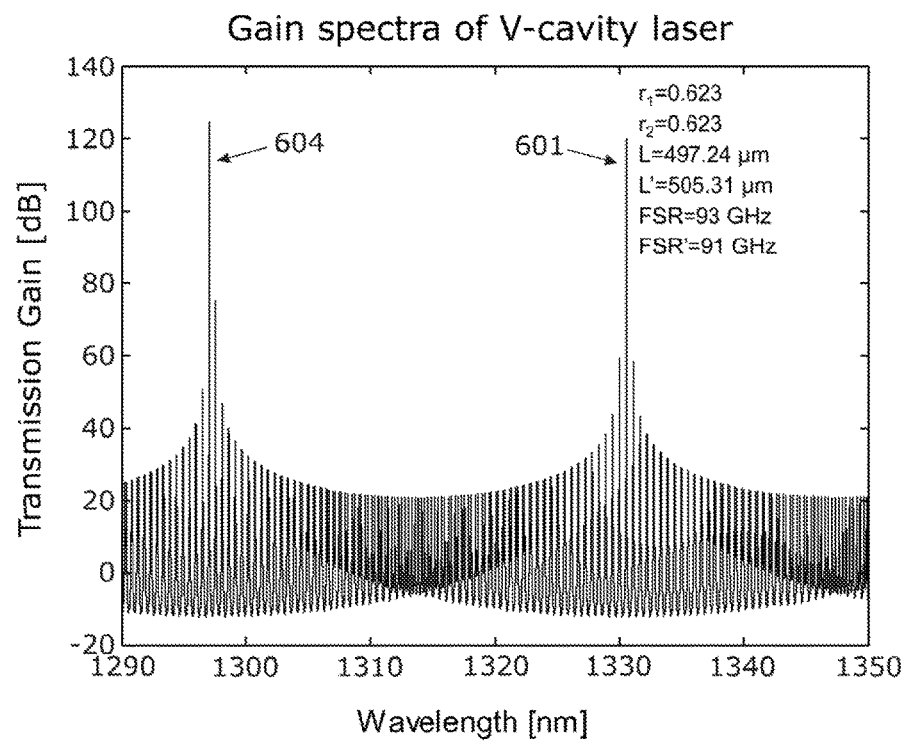
FIG. 6D is a graph showing example gain against wavelength for an example tunable laser according to the present disclosure.

Effective lasing may occur just for the overlapping resonant wavelengths, i.e. for the wavelength or wavelengths which are resonant in both the first laser cavity and the second laser cavity. This may be because a lasing threshold of the gain sections is met only by the overlapping resonant wavelengths (a lasing threshold is an optical power threshold above which lasing can occur). FIG. 6D shows an example of wavelength against gain in the first and second cavities over a larger range from 1290 nm to 1350 nm once this destructive and constructive interference is taken into account. As can be seen there is significant gain for the overlapping resonant wavelength(s), in this example 1297.6 nm and 1330.5 nm. The example of FIG. 6D is based on a model with a FSR for the first cavity (FSR1) of 93 GHz and a FSR for the second cavity (FSR2) of 91 GHz.

Furthermore, effective lasing may occur only for wavelengths which are within a gain bandwidth of the first gain section and the second gain section. The gain bandwidth is the range of wavelengths over which the gain section is capable of lasing and amplifying light. The gain bandwidth may depend upon the materials and structure of the gain section.

In order to output just one wavelength of laser light at a time, the tunable laser may be designed such that there is only one overlapping resonant wavelength within the lasing bandwidth of the first gain section and the second gain section. For example, a length of the first laser cavity and a length of the second laser cavity may be such that within the lasing bandwidth of the first and second gain sections there is only one resonant wavelength overlap between the first and second laser cavities. The example of FIG. 6D shows two resonant wavelength overlaps with strong gain, one at 1297 nm indicated by reference numeral 604 and another at 1330.5 nm indicated by reference numeral 601. However, if in another example the gain bandwidth of the first gain section and second gain section was between 1310 nm and 1345 nm, then only the overlapping resonant wavelength peaks 601 would be within this gain bandwidth and experience strong gain. The other resonant wavelength overlap 604 at 1297.6 nm would in that case experience little gain as it would be outside the gain bandwidth.

The laser may be tuned by adjusting the resonant wavelengths of the first laser cavity and/or by adjusting the resonant wavelengths of the second laser cavity. Adjusting the resonant wavelengths of a cavity means shifting the frequency comb of resonant wavelengths. For example, if resonant wavelengths of the first laser cavity include 1310 nm, 1311 nm and 1312 nm, then by tuning the first laser cavity the resonant wavelengths may be adjusted to 1310.5 nm, 1311.5 nm and 1312.5 nm or in the other direction to 1309.5 nm, 1310.5 nm and 1311.5 nm. By tuning the first laser cavity to adjust the resonant wavelengths of the first laser cavity, due to the slightly different FSRs of the first laser cavity and the second laser cavity, the overlapping resonant wavelengths may be shifted by an even smaller amount. This is known as the Vernier effect. The Vernier effect thus allows relatively larger shifts in the resonant wavelength of one of the laser cavities to lead to relatively smaller shifts in the overlapping resonant wavelength(s). This facilitates tuning to a high degree of precision. If both the first laser cavity and the second laser cavity are independently tunable, then the tuning precision is further enhanced. In general if one of the laser cavities is tunable then the output wavelength of the tunable laser may be stepped between discrete wavelengths. However, if both the first and second laser cavities are independently tunable then the output wavelength of the tunable laser may be varied continuously over a range.

A laser cavity may for example be tuned by injecting current into the gain section or otherwise heating the gain section. Both these actions change the temperature of the gain section thus modifying the effective refractive index of the gain section. A change in the effective refractive index changes the overall length of the laser cavity in terms of number of wavelengths and thus changes the wavelengths at which light is resonant.

that light optically coupled between the first and second laser cavities undergoes a 180 degree phase shift. That is the optical coupler 30 is to couple light between the first III-V semiconductor waveguide and the second III-V semiconductor waveguide such that there is a 180 phase difference between light entering the optical coupler 30 and leaving the optical coupler. This may help to reduce the side mode suppression ratio of the output laser light. The optical coupler 30 may include a reflector 31, such as a DBR or an etched slot or facet to reflect light coupled from the first cavity to the second cavity or vice versa back in the opposite direction towards the reflector 41 or 51 at the other end of the cavity. The reflector 31 may provide the 180 degree phase shift in the optically coupled light.

Figure 7:
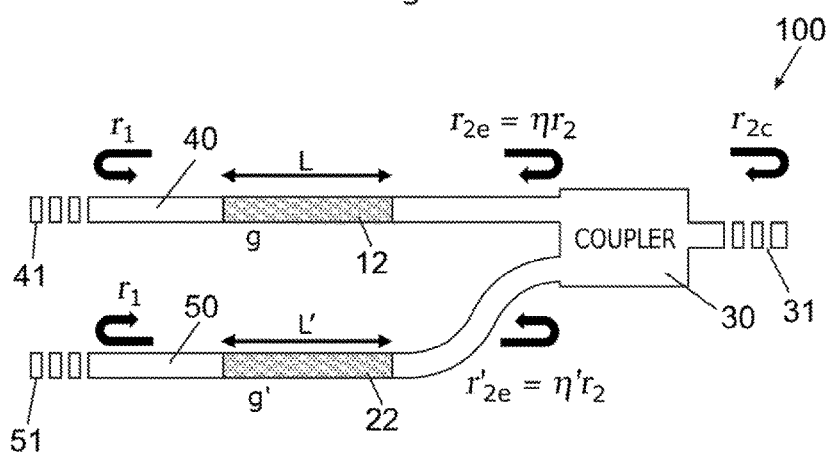
FIG. 7 shows a schematic view of an example tunable laser according to the present disclosure.

FIG. 7 shows various parameters, including a length L of the first gain section, a gain g of the first gain section, a length L' of the second gain section and a gain g' of the second gain section. Further parameters affecting the behavior of the laser may include the following. $C_{11}$: the self-coupling coefficient of the first laser cavity, $C_{21}$: cross-coupling coefficient from the second laser cavity to the first laser cavity, $C_{12}$: cross-coupling coefficient from the first laser cavity to the second laser cavity, $C_{22}$: self-coupling coefficient of the second laser cavity, $r_1$: field reflection of the first and second reflectors at the open end of the first and second laser cavities, $r_2$: field reflection of closed optical coupler end of the laser cavities, k: wavenumber of the first laser cavity, k' wavenumber of the second laser cavity.

Based on the above the effective field reflections of the first and second laser cavities may be calculated as follows:

Effective Field Reflection Calculation:

$$r_{2e} = \eta r_2$$

$$\eta = C_{11} + C_{21}C_{12}r_1r_2 e^{2(g'+jk')L'}\left(1 + C_{22}r_1r_2 e^{2(g'+jk')L'} + C_{22}^2 r_1^2 r_2^2 e^{4(g'+jk')L'} + \ldots\right) =$$

$$C_{11} + \frac{C_{21}C_{12}r_1r_2 e^{2(g'+jk')L'}}{1 - C_{22}r_1r_2 e^{2(g'+jk')L'}}$$

$$r'_{2e} = \eta' r_2$$

$$\eta' = C_{22} + C_{21}C_{12}r_1r_2 e^{2(g+jk)L}(1 + C_{11}r_1r_2 e^{2(g+jk)L} + C_{11}^2 r_1^2 r_2^2 e^{4(g+jk)L} + \ldots) =$$

$$C_{22} + \frac{C_{21}C_{12}r_1r_2 e^{2(g+jk)L}}{1 - C_{22}r_1r_2 e^{2(g+jk)L}}$$

FIG. 7 is a schematic diagram showing an example of the tunable laser similar to FIG. 1. Note that the first III-V semiconductor waveguide 10 may have a different length to a length of the second III-V semiconductor waveguide 20. This causes the FSR of the first laser cavity to be different to the FSR of the second laser cavity. Another way of achieving different FSRs may be for the first and second silicon-based waveguides to have different lengths.

FIG. 7 shows how at the optical coupler 30 there may be light from the first laser cavity which is incident on the optical coupler 30 and reflected back into the first laser cavity ($r_{2e}$), light from the second laser cavity which is incident on the optical coupler 30 and reflected back into the second laser cavity ($r'_{2e}$), and light coupled by the optical coupler 30 from the first laser cavity into the second laser cavity or from the second laser cavity into the first laser cavity ($r_{2C}$).

Light which is reflected undergoes a 180 degree phase shift. Further, the optical coupler 30 may be designed such One of the first and second silicon-based waveguides is associated with the output of the tunable laser. In the example of FIG. 2, the first silicon-based waveguide 40 is associated with the output of the tunable laser. As can be seen in FIG. 2, the silicon-based waveguide 40 associated with the output is substantially perpendicular to an edge of a photonic integrated chip in which the tunable laser is formed. In this way it is easier to optically couple the output of the tunable laser to an external optical component, such as an external waveguide, external fiber or to another photonics integrated chip, as output light is at right angles to edge.

In some examples, the first silicon-based waveguide 40 and the second silicon-based waveguide 50 may be parallel to each other. This may make tuning and optical balancing of the first and second laser cavities more reliable and easier to calculate. Thus, in some examples, both the first silicon-based waveguide and the second silicon-based waveguide may be perpendicular to an edge of the photonic integrated chip.

At least one of the first III-V waveguide 10 and the second III-V waveguide 20 may include a bend of at least 60 degrees. The part of the waveguide including the bend is referred to as the bend section. For instance the III-V waveguide may include a straight section which is perpendicular with an edge of the chip and a bend section which deviates from this direction. In the illustrated examples the second waveguide includes a bend section 24 (see e.g. FIG. 2). The bend section 24 may include two bends, one inward towards the other III-V waveguide and one back towards the perpendicular direction. The bends may be of more than 60 degrees. In one example each of the bends may be of approximately 90 degrees.

The bend section makes it possible for the first and second III-V waveguides to be close to each other where they join the optical coupler 30 to promote optical coupling between them, but spaced far enough apart from each at the gain sections so as not to interfere with each other. It also enables the sections of the III-V waveguides remote from the optical coupler 30 to be parallel to each other and/or to run in a direction perpendicular to an edge of the chip. If the waveguide runs perpendicular to the edge of the chip, then as mentioned above, this makes butt-coupling to an external waveguide, fiber or other external optical component easier. Further, the bend section enables one of the III-V waveguides to be longer than the other while maintaining a compact footprint.

Figure 8:
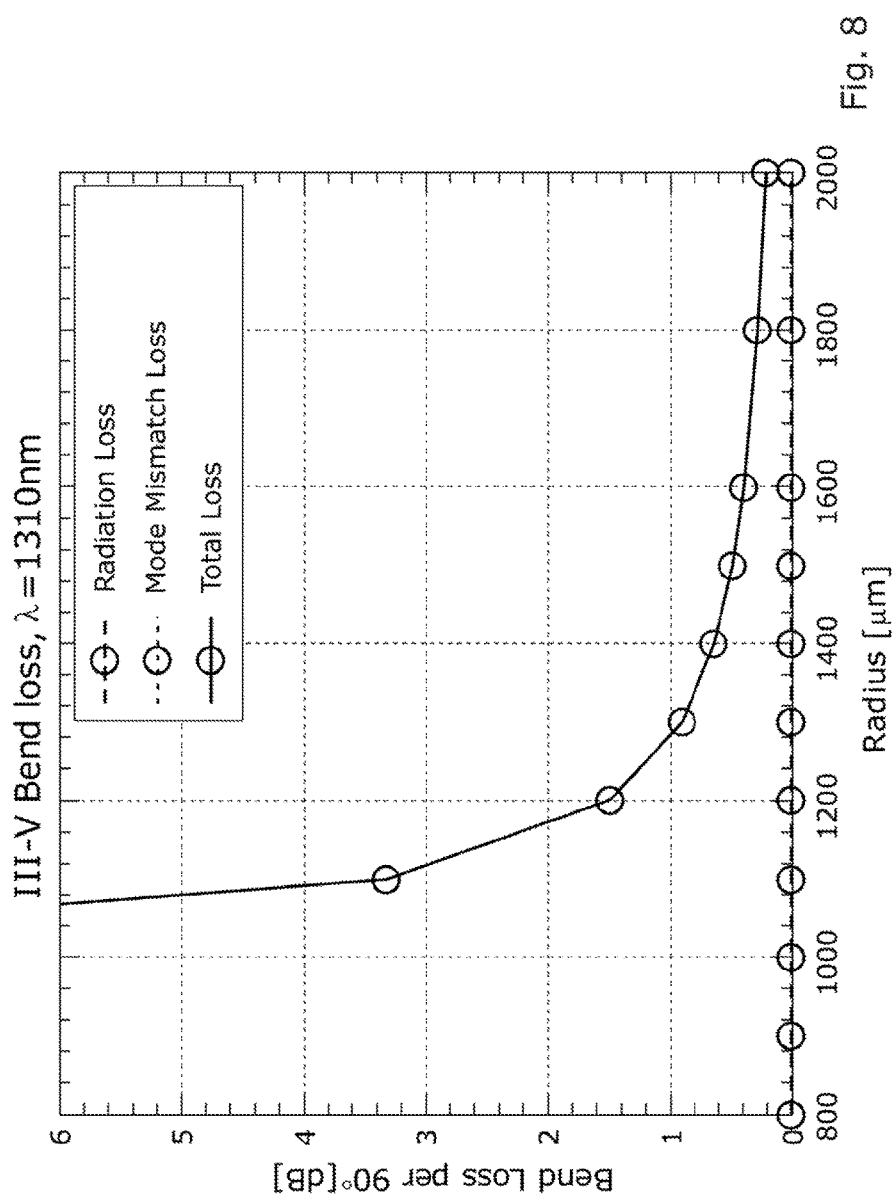
FIG. 8 is a graph showing bend loss against bend radius for an example III-V semiconductor waveguide.

A bend may have a bend radius. The shorter the bend radius, the tighter the bend. FIG. 8 shows an example of the III-V waveguide loss against bend radius for a 90 degree bend at 1310 nm wavelength. The total loss (solid line) and is the sum of the mode mismatch loss (dotted line) between the bent and straight sections of the waveguide and the radiation loss (dashed line) of the bent section of the waveguide. In this example, the radiation loss is negligible and so the total loss is substantially the same as the mode mismatch loss. For this reason the dotted line cannot be seen clearly in FIG. 8 as it overlaps with the solid line representing total loss. In one example according to the present disclosure, the bend may have a bend radius of between 1400 µm and 2000 µm. In one example, the mode mismatch loss may be further improved by using adiabatic waveguide bends where the radius of curvature gradually changes along the bend to ensure the modes are matched at the interface between the straight and bent sections of the waveguide.

Figure 9:
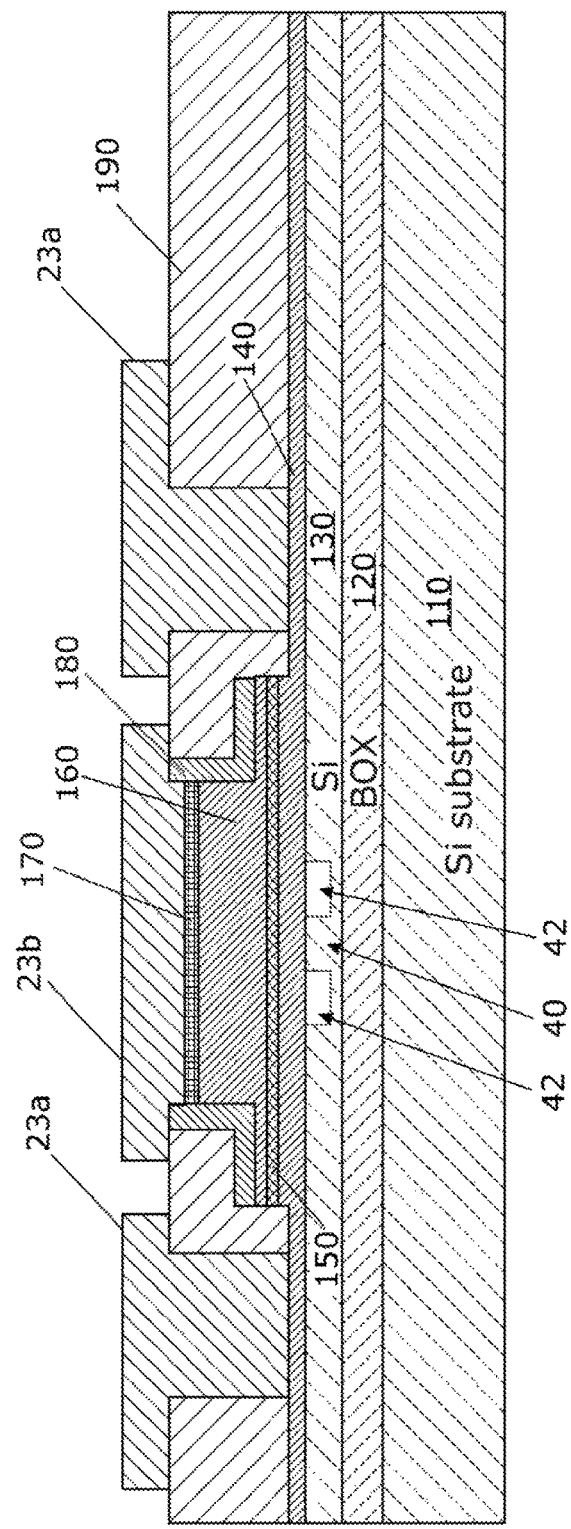
FIG. 9 is a cross sectional view of an example gain section of a III-V semiconductor waveguide.

FIG. 9 shows an example cross section of the first gain section of the first III-V waveguide with respect to the line A-A of FIG. 2. The second gain section of the second III-V waveguide may have the same or a similar structure.

The SOI structure includes a first silicon-based layer 110, insulator layer 120 (e.g. buried oxide or BOX layer) and second silicon-based layer 130 as discussed above with reference to FIG. 3. As shown in the cross-section of FIG. 9, the first silicon-based waveguide 40 is formed in the second silicon-based layer 130. On either side of the silicon-based waveguide 40, there may be air gaps or isolating material 42 of a relatively lower refractive index than the waveguide. The III-V structure is mounted on top of the SOI structure, such that the lower cladding layer 140 overlies the second silicon-based layer 130. An active layer 150 of the III-V structure is positioned between the lower cladding layer 140 and the upper cladding layer 160. It can be seen that a width of the first silicon-based waveguide 40, from left to right in FIG. 9, is much less than a width of the gain section of the first III-V waveguide which lies above the first silicon-based waveguide. In one example, the height of the insulator layer 120 of the SOI structure may be 1 µm, while the height of the second silicon-based layer may be 300 nm.

A metal contact 23b may be positioned on top of the upper cladding layer 160 of the first III-V waveguide. There may be an intermediate layer 170, such as InGaAs, between the metal contact 23b and the upper cladding layer 160. The intermediate layer 170 may serve as a highly doped thin semiconductor layer that facilitates an ohmic contact to the metal contact 23b. For example, the intermediate layer 170 may be heavily doped such that a depletion region at the interface between the metal contact 23b and the intermediate layer 170 is so thin that tunneling of charge carriers may occur thus leading to very low or negligible resistance. There may be a passivation and optically isolating layer 180, such as SiO$_2$ on top of other parts of the upper cladding layer 160 so as to help seal sidewalls and isolate light within the III-V waveguide from the metal contact 23b. The metal contact 23b may for example comprise Pt, Ti, Pt or Au. Metal contacts 23a may be positioned on top of the lower cladding layer 140 on either side of the first III-V waveguide. The metal contacts 23a may for example comprise Ni, Ge, Au, Ni or Au. An insulating layer such as a Polyimide layer 190 may electrically isolate the metal contacts from each other and may also protect the upper surface of the SOI structure. In one example the metal contact 23b may act as a positive terminal, while the metal contacts 23a may act as negative terminals.

Figure 10:
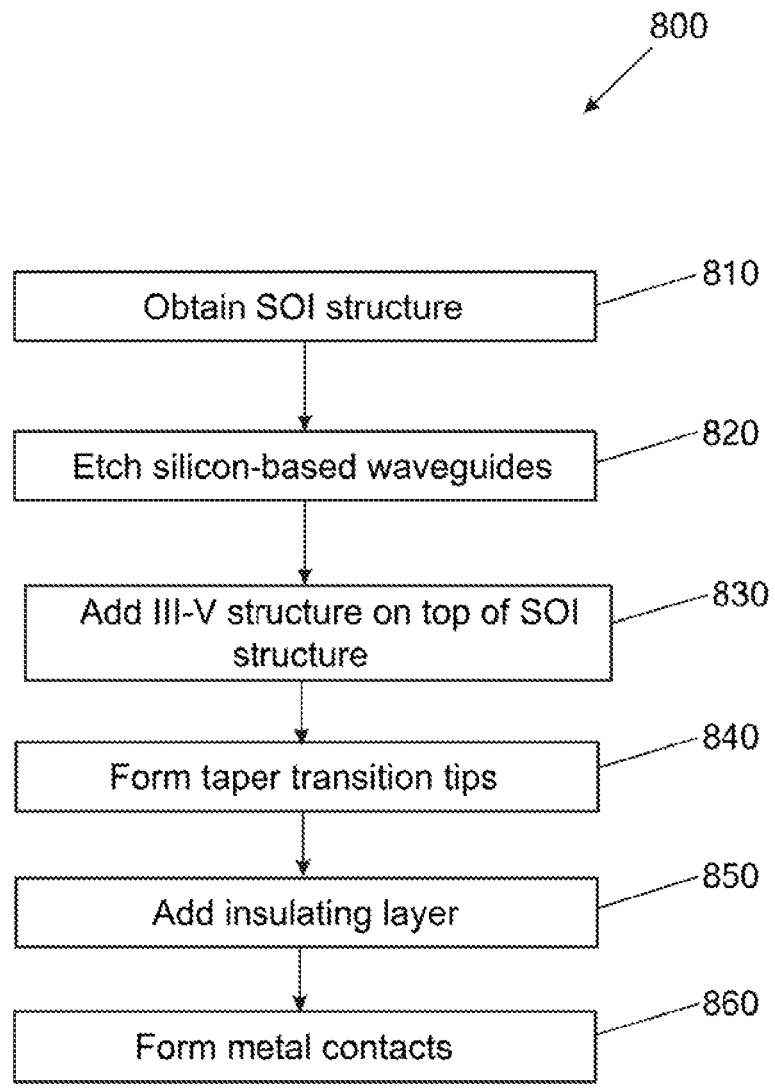
FIG. 10 is a flow diagram showing an example method of manufacturing an example tunable laser according to the present disclosure.

FIG. 10 is a flow diagram showing an example method 800 of manufacturing a tunable laser as described in the examples above.

At block 810 a SOI wafer is obtained. The SOI wafer may be marked to plan the silicon-based waveguides.

At block 820 the silicon-based waveguides are etched in the upper silicon-based layer of the SOI wafer. Reflectors 41 and 51 at the end of each of the silicon-based waveguides 40, 50 may also be formed at this point. For example, by etching DBRs or etching or cleaving slots or facets.

At block 830 the III-V structure is added on top of the SOI structure. For example by direct bonding or adhesive bonding. If a hot direct bonding method is used, then prior to block 830 vertical outgassing channels may be formed so that gases used in the bonding process may be buried in the insulator layer of the SOI structure.

At block 840, the taper transition tips are formed on each of the first and second silicon-based waveguides.

At block 850, an insulating layer such as polymide is added over the III-V structure.

At block 860 the metal contacts are formed, e.g. by an etching and/or deposition process.

In one example, blocks 810 to 820 are carried out at the wafer level, i.e. the SOI structure for a plurality of lasers is formed on a silicon-based wafer. Blocks 830-860 which relate to the III-V structure may be carried out at the wafer level as well. So that a plurality of lasers may be formed on a hybrid SOI and III-V wafer structure, which is subsequently divided into a plurality of chips, each chip including a separate widely tunable laser. In other examples, the SOI structure may be cut into separate chips and then blocks 830-860 may be performed separately at the level on each chip to form each laser.

All of the features disclosed in this specification (including any accompanying claims, abstract and drawings), and/or all of the blocks of any method or process so disclosed, may be combined in any combination, except combinations where at least some of such features and/or blocks are mutually exclusive. Furthermore, except where explicitly stated otherwise or where the context or logic demands otherwise, the processes described herein may be carried out in any order and are not limited to the specific order shown in the particular examples. Some the processes or method blocks described herein may be carried contemporaneously with each other.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example of a generic series of equivalent or similar features.

What is claimed is:

1. A tunable hybrid laser comprising:
a III-V semiconductor structure mounted on a silicon on insulator (SOI) structure, the III-V semiconductor structure comprising:
   a III-V semiconductor optical coupler;
   a first III-V semiconductor waveguide including a first gain section connected at a first end to the III-V semiconductor optical coupler and optically coupled at a second end to a first silicon-based waveguide of the SOI structure; and
   a second III-V semiconductor waveguide including a second gain section connected at a first end to said III-V semiconductor optical coupler and optically coupled at a second end to a second silicon-based waveguide of the SOI structure;
   wherein each of the first III-V waveguide, the second III-V waveguide and the optical coupler include an active layer positioned between a lower cladding layer and an upper cladding layer, wherein the first III-V waveguide, the second III-V waveguide and the optical coupler are integral parts of the III-V semiconductor structure such that the active layer, the upper cladding layer, and the lower cladding layer extend through the first III-V waveguide, the second III-V waveguide, and the optical coupler;
a first reflector located on the first silicon waveguide; the first reflector and the optical coupler forming ends of a first laser cavity which includes the first gain section; and
a second reflector located on the second silicon waveguide; the second reflector and the optical coupler forming ends of a second laser cavity which includes the second gain section;
wherein the first laser cavity and the second laser cavity have different free spectral ranges (FSRs) and at least one of the first laser cavity and the second laser cavity is tunable, and wherein one of the first or second reflectors comprises an output for laser light corresponding to an overlapping resonant wavelength within a lasing bandwidth of the first and second gain sections,
wherein the optical coupler is configured to couple light between the first III-V semiconductor waveguide and the second III-V semiconductor waveguide such that there is a 180 degree phase difference between light entering the optical coupler and light leaving the optical coupler.

2. The tunable hybrid laser of claim 1 wherein the first III-V semiconductor waveguide includes a taper transition tip to couple laser light from the first III-V semiconductor waveguide to the first silicon waveguide and wherein the second III-V semiconductor waveguide includes a taper transition tip to couple laser light from the second III-V semiconductor waveguide to the second silicon waveguide.

3. The tunable hybrid laser of claim 1 wherein the first gain section has a width at least three times larger than a width of the first silicon waveguide and wherein a width of the tapered transition tip is less than the width of the first silicon waveguide.

4. The tunable hybrid laser of claim 1 wherein the upper cladding layer and lower cladding layer comprise InP and the active layer comprises AlInGaAs or InGaAsP.

5. The tunable hybrid laser of claim 1 wherein the first III-V semiconductor waveguide includes a taper transition tip to couple laser light from the first III-V semiconductor waveguide to the first silicon waveguide, the taper transition tip comprising a first taper section including the upper cladding layer and the active layer and a second taper section including the lower cladding layer but not the upper cladding layer and the active layer, wherein the second taper section extends beyond the first taper section.

6. The tunable hybrid laser of claim 1 wherein the first reflector is a distributed bragg reflector (DBR) and the second reflector is a distributed bragg reflector (DBR).

7. The tunable hybrid laser of claim 1 wherein the first III-V semiconductor waveguide has a different length to a length of the second III-V semiconductor waveguide.

8. The tunable hybrid laser of claim 1 wherein the second III-V semiconductor waveguide includes at least one bend of more than 60 degrees.

9. The tunable hybrid laser of claim 1 wherein the tunable hybrid laser is formed on a photonics integrated chip, the first reflector forming the output of the tunable hybrid laser and an end portion of the first silicon-based waveguide including the first reflector is substantially perpendicular to an edge of the photonics integrated chip.

10. The tunable hybrid laser of claim 1 wherein one of the first reflector and second reflector has a lower reflectance than the other, and wherein the output of the tunable hybrid laser is associated with one of the first and second reflectors having the lower reflectance.

11. The tunable hybrid laser of claim 1 wherein the optical coupler is a multimode-interference coupler or a directional coupler.

12. A tunable laser comprising:
a III-V semiconductor structure including:
   a first branch including a first gain section;
   a second branch including second gain section;
   an optical coupler to couple a first end of the first branch with a first end of the second branch;
   wherein each of the first branch, the second branch, and the optical coupler include an active layer positioned between a lower cladding layer and an upper cladding layer, wherein the first branch, the second branch, and the optical coupler are integral parts of the III-V semiconductor structure such that the active layer, the upper cladding layer, and the lower cladding layer extend through the first III-V waveguide, the second III-V waveguide, and the optical coupler, wherein the optical coupler is configured to couple light between the first branch and the second branch such that there is a 180 degree phase difference between light entering the optical coupler and light leaving the optical coupler;
the III-V semiconductor structure being mounted on a silicon on insulator (SOI) structure, the silicon on insulator (SOI) structure including:
   a first silicon-based waveguide that is optically coupled to the first branch, the first silicon-based waveguide including a first reflector that forms a first laser cavity together with the first gain section and the optical coupler;

a second silicon-based waveguide that is optically coupled to the second branch and which includes a second reflector that forms a second laser cavity together with the second gain section and the optical coupler;

wherein the first laser cavity has a free spectral range (FSR) which is different to a FSR of the second laser cavity, wherein a resonance wavelength of at least one of the first laser cavity and the second laser cavity is tunable to provide wavelength tuning of the tunable laser via the Vernier effect, and wherein one of the first or second reflectors comprises an output for laser light corresponding to an overlapping resonant wavelength within a lasing bandwidth of the first and second gain sections.

13. The tunable laser of claim 12 wherein the first silicon-based waveguide is optically coupled to the first branch by a taper region of the first branch and the second silicon-based waveguide is optically coupled to the first branch by a taper region of the second branch.

14. The tunable laser of claim 12 wherein the first gain section includes electrical contacts and the second gain region includes electrical contacts, said electrical contacts of the first and second gain sections being electrically isolated from an electrical contact of the optical coupler.

15. A tunable laser comprising:
an optical coupler to couple light between a first laser cavity and a second laser cavity;
the first laser cavity extending between the optical coupler and a first reflector and including a first gain section, a first silicon-based waveguide and a first direct band gap (DBG) semiconductor waveguide which includes the first gain section;
the second laser cavity extending between the optical coupler and a second reflector and including a second gain section, a second silicon-based waveguide and a second DBG semiconductor waveguide which includes the second gain section; and wherein a resonant wavelength of the first laser cavity is tunable and a resonant wavelength of the second laser cavity is tunable independently of the resonant wavelength of the first laser cavity, and wherein one of the first or second reflectors comprises an output for the light corresponding to an overlapping resonant wavelength within a gain bandwidth of the first and second gain sections; and wherein the optical coupler, first DBG semiconductor waveguide, and second DBG semiconductor waveguide are components of a DBG semiconductor structure mounted on a silicon on insulator (SOI) structure comprising the first silicon-based waveguide and the second-silicon-based waveguide, wherein each of the first DBG semiconductor waveguide, the second DBG semiconductor waveguide and the optical coupler include an active layer positioned between a lower cladding layer and an upper cladding layer, wherein the first DBG semiconductor waveguide, the second DBG semiconductor waveguide, and the optical coupler are integral parts of the DBG semiconductor structure such that the active layer, the upper cladding layer, and the lower cladding layer extend through the first DBG semiconductor waveguide, the second DBG semiconductor waveguide, and the optical coupler.

16. The tunable laser of claim 15 wherein:
the first laser cavity comprises a taper transition tip to optically couple light between the first DBG semiconductor waveguide and the first silicon-based waveguide; the second laser cavity comprises a taper transition tip to optically couple light between the second DBG semiconductor waveguide and the second silicon-based waveguide; and
the optical coupler is configured to couple light between the first DBG semiconductor waveguide and the second DBG semiconductor waveguide.

17. The tunable laser of claim 15 wherein a length of the first laser cavity and a length of the second laser cavity are such that within the gain bandwidth of the first and second gain sections there is only one resonant wavelength overlap between the first and second laser cavities.

* * * * *